(12) United States Patent
Mashak et al.

(10) Patent No.: US 6,229,372 B1
(45) Date of Patent: May 8, 2001

(54) ACTIVE CLAMP NETWORK FOR MULTIPLE VOLTAGES

(75) Inventors: Benjamin William Mashak; Robert Russell Williams, both of Rochester, MN (US); Steven Howard Voldman, South Burlington, VT (US); David TinSun Hui, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/443,609

(22) Filed: Nov. 19, 1999

Related U.S. Application Data (63) Continuation-in-part of application No. 09/065,800, filed on Apr. 23, 1998.

(51) Int. Cl.[7] .................................................. H03K 5/08
(52) U.S. Cl. ........................... 327/318; 327/309; 327/328
(58) Field of Search .................................. 327/318, 309, 327/313, 314, 321, 325, 328, 327, 543, 333, 315, 331; 361/56, 91, 90

(56) References Cited

U.S. PATENT DOCUMENTS

| | | | |
|---|---|---|---|
| 3,937,988 | * | 2/1976 | DeClue et al. ........................ 327/321 |
| 4,015,147 | * | 3/1977 | Davidson et al. .................... 327/566 |
| 4,943,739 | * | 7/1990 | Slaughter ............................... 326/30 |
| 4,958,093 | * | 9/1990 | Kosson et al. ........................ 327/321 |
| 5,103,118 | * | 4/1992 | Peterson ................................ 326/27 |
| 5,227,677 | * | 7/1993 | Furman ................................. 326/21 |
| 5,528,190 | * | 6/1996 | Honnigford ......................... 327/328 |
| 5,631,793 | * | 5/1997 | Ker et al. .............................. 361/56 |
| 6,075,399 | * | 6/2000 | Voldman et al. .................... 327/309 |

* cited by examiner

Primary Examiner—Timothy P. Callahan
Assistant Examiner—Hai L. Nguyen
(74) Attorney, Agent, or Firm—Karuna Ojanen; James R. Nock (57) ABSTRACT

An active clamp circuit for digital circuits includes a first MOSFET serially connected between an upper power supply voltage and an input terminal to be clamped, and a second MOSFET serially connected between a lower voltage power supply and the input terminal. The voltages at the gates of the first and second MOSFETs are held at constant first and second reference voltages by a reference circuit and the first reference voltage at the gate of the first MOSFET is less than the second reference voltage at the gate of the second MOSFET. The first and second reference voltages can be changed by connecting the reference circuit to power supply voltages other than the power supply voltages to which the first and second MOSFETs are connected. The reference voltages can also be varied by adding stages of transistors which act as resistors in parallel to the reference circuit. When the first reference voltage is to be varied, it is recommended that the transistors of opposite type be biased independently. The clamping action can be switched on or off, and when the clamping action is switched off, the voltage on the first and second MOSFETs is kept from floating by connecting the gates to turn-off transistors. The device is particularly suited for use with silicon-on-insulator.

20 Claims, 6 Drawing Sheets

ACTIVE CLAMP NETWORK FOR MULTIPLE VOLTAGES

RELATED APPLICATION

This is a continuation-in-part application under 37 CFR 1.53(b) of copending patent application Ser. No. 09/065,800 entitled, "Switchable Active Clamp Network", filed on Apr. 23, 1998, which is hereby incorporated by reference in its entirety.

BACKGROUND OF THE INVENTION

1. Field of the Invention

This invention relates to active clamp circuits for clamping more than one voltage level useful for reducing electrical overshoot and undershoot, for minimizing ringing and similar noise problems, for providing electrostatic discharge (ESD) protection, particularly in high speed metal oxide semiconductor (MOS) and silicon-on-insulator (SOI) integrated circuit applications.

2. Description of Related Art

A computer comprises a multitude of circuits which need to electrically interact with each other and with circuits external to the computer via signals on cables. These external circuits may be contained in other computers, memory storage devices, input/out devices, networks, etc. The signals are in the form of digital ones and zeroes which merely represent voltage levels on the cables. As computers evolve, the voltage levels have decreased so that a digital one which was once 5 volts is now 3.3. volts, 1.8 volts, 1.2 volts and even lower. Moreover, circuits operating at one voltage level may need to transfer signals to and/or receive signals from circuits operating at other voltage levels; or an integrated circuit card may need to be replaced and the replacement card may operate at a different, usually lower, voltage level. A special circuit called a clamping circuit partially terminates and protects each circuit from voltages that are outside its operating range.

Clamping circuits maintain voltages of an electronic circuit within an acceptable range, that is, clamping circuits control electrical overshoot when a voltage exceeds an upper limit and undershoot when voltages decrease below a lower limit at the signal input of a digital circuit to provide a reliable logic signal under adverse and noisy conditions. Ideally the input voltage to each element in a digital circuit will be in only one of two distinct logic states, either an upper digital voltage or a lower digital voltage, corresponding to the digital ones and zeros of the circuit. As mentioned and as used in the following discussion, the positive terminal of the power supply will be referred to as Vdd. In older designs, this voltage is typically +5 volts, however, in newer designs, it may be 3.3, 2.5, 1.8, 1.2 volts or even lower. The lower voltage terminal of the power supply is referred to as Vss, and this voltage is usually at ground potential which may be zero volts. In an ideal system, the input voltage switches instantly between the high voltage state, a digital one, and the low voltage state, a digital zero, never going above the upper voltage limit nor below the lower voltage limit, and spending substantially no time at any intervening voltage between the two states.

In real circuits, however, the input voltage takes a finite amount of time to switch between the two states. Further, when switching between the two states, the input voltage will often exceed the upper limit, i.e., overshoot the voltage, corresponding to the new state, then oscillate, also called ring, around the new voltage before settling down. Clamping circuits, also referred to as termination networks, are designed to minimize the ringing which can seriously degrade circuit performance. A good clamping circuit should dampen ringing and reduce noise so that the signal at the input remains at or near one of the two desired voltage states and switches between those states quickly and cleanly.

Improved clamping performance comes about by supplying or draining current as quickly as possible to/from the network at the input to the circuit being clamped whenever the voltage at the input exceeds or falls below the desired voltage. In order to supply sufficient current, the clamping circuit should have low impedance and a low reflection coefficient in the vicinity of the upper and lower voltages corresponding to the two digital logic states. On the other hand, in order to maximize switching speed between the two logic states, the impedance of the clamping circuit and the reflection coefficient should be very high during switching for the brief time when the input voltage is between the upper and lower digital voltages. Passive clamping circuits which are still widely used, are unable to effectively meet these opposing requirements for high performance applications.

Another requirement for digital circuits is some form of electrostatic discharge (ESD) protection. Generally, separate ESD protection circuits are provided at the input of the circuit to limit the voltage that can be imposed on the circuit at the input terminal even when the circuit is unpowered. It would be desirable if the ESD protection could be incorporated into the clamping circuit. The ability to rapidly drain or source current is important for both clamping and ESD protection. Older designs for clamping circuits that use current limiting resistors do not provide good ESD protection.

As metal oxide semiconductor technology has improved, MOS devices have been constructed with shorter gate lengths, thinner gate oxides and faster response times. As the gate oxide becomes thinner, the device must be powered with a lower voltage power supply to avoid breakdowns and leakage. Lower power supply voltages are also advantageous in reducing power consumption, decreasing heating, and increasing speed through smaller voltage swings. Such lower voltage designs, however, need even more careful control over the input signal to prevent erratic operation due to ringing or other noise at the input. Good ESD protection for such designs is also critical.

A typical prior art five volt system has used a passive clamping circuit in which one diode is placed between the input terminal and Vss and another is placed between the input terminal and Vdd. The diode between the input terminal and Vdd conducts when the voltage at the input terminal rises sufficiently above the upper digital voltage to turn on the diode. Thus, this diode limits the input voltage to about 0.7 volts above the desired maximum input voltage, but permits 0.7 volt ringing around the upper digital voltage. The second diode is positioned between the input terminal and Vss and conducts when the voltage at the input terminal falls one diode drop below the lower digital voltage, usually zero volts. This prevents ringing in excess of about 0.7 volts, but still permits ringing having a magnitude less than the value needed to turn on the passive diode clamp. Passive clamp circuits of this type work in five volt systems because the amplitude of the ringing is relatively small compared to the difference between the upper and lower digital voltages. In lower voltage systems, such as a 3.3 volt system, this 0.7 volt ringing affects the noise tolerance. In voltage systems of 2.5 volts, 1.8 volts, and even 1.2 volts, such ringing is unacceptably large, producing erratic operation in noisy environments. During clamping by a passive diode clamp of this type, the excess signal voltage on the input is pulled towards or clamped to the positive Vdd supply voltage and the lower signal voltage state is pulled towards or clamped to the lower voltage supply Vss or ground. Another concern with the use of diodes in a clamping circuit is that they don't turn off instantly because they have a nonzero storage charge.

In the active clamping circuit of the present invention, improved performance is achieved by activating the clamp as soon as or slightly before the input terminal voltage swings above or below the bounds set by the upper and lower digital voltages. Performance is also improved by driving the input terminal voltage to the upper digital voltage via a connection to Vss when the input voltage is too high, i.e., above the upper voltage which is usually Vdd, and by driving the input terminal voltage to the lower digital voltage via a connection to Vdd when the input terminal voltage is too low, i.e., below the lower digital voltage which is usually Vss. This increases the speed at which the clamping circuit operates as compared to prior art designs which drive excessively low voltages through a connection to the low voltage supply (Vss) and excessively high voltages through a connection to the high voltage supply (Vdd).

To avoid some of the problems with older designs, source terminated drivers have been used in MOS circuits to lower the drive current of the driver into the net. Unfortunately, this increases delay and slows circuit response. Another problem with this solution results from complex process tolerance requirements during construction of MOS devices. This results in poor control of the driver output impedance which also causes ringing.

Silicon-on-insulator (SOI) technology further improves the speed at which transistors perform and reduces the voltages required. SOI refers to placing a thin layer of silicon on top of an insulator, such as silicon oxide or glass. Transistors are then build on top of this thin film of SOI. The SOI layer not only reduces the capacitance of the semiconductor switch, so it operates faster, but also eliminates the "body effect" which causes lower current and lower performance in bulk CMOS technology. Because of these characteristics of SOI, it can also operate at lower power than MOS technology. SOI technology is especially useful in portable and wireless applications.

For SOI designs and low voltage MOS designs, an active clamping circuit is needed, particularly in high performance low voltage designs where the clamp must hold the ringing to much less than the 0.7 volt limit of a passive diode clamp. Active clamp circuits employing transistors instead of diodes are known, but heretofore they have been bipolar in design, and thus are not suited for construction with the remainder of the MOS circuitry. Another difficulty with prior art designs is that they have been similar to the passive diode clamp circuit described above. They have clamped the high logic signal to the higher Vdd power supply and the lower voltage logic signal to the lower voltage supply Vss. While this is functional, it cannot supply current as quickly to damp out ringing and noise as can a circuit designed according to the present invention. A further problem with prior art clamping circuit designs is the use of current limiting resistors which slow the clamping circuit response time and make them unsuitable for modern high speed MOS field effect transistor (MOSFET) and SOI circuits.

There is also a need for low power consumption designs for active clamping circuits and for circuits that may be turned off remotely, particularly during testing operations. These features are not available in prior art designs.

Bearing in mind the problems and deficiencies of the prior art, it is therefore an object of the present invention to provide a clamping circuit specifically adapted for MOS and SOI circuits that turns on immediately at the desired clamping voltage, instead of at a diode voltage drop away from the desired voltage.

It is another object of the present invention to provide a clamping circuit that has high impedance during switching, for high switching speed, but low impedance when clamping for rapid reduction of any ringing.

A further object of the invention is to provide a clamping circuit that may be switched on and off.

Still another object of the present invention is to provide a clamping circuit which has low power consumption.

It is yet another object of the present invention is to provide a clamping circuit that provides ESD protection at the input of an attached circuit.

Still another object of the present invention is to provide a clamping system suitable for use with low voltage power supply systems.

It is yet another object of the invention to provide compatibility between two systems of different voltage levels.

It is still another object of the invention to provide a clamping system which has the capability of selecting more than one voltage level to clamp.

A further object of the invention is to provide a clamping circuit that is compatible with and useful for SOI and triple well technologies.

Another object of the present invention is to provide an active clamping circuit which also operates when unpowered to provide ESD protection.

Still other objects and advantages of the invention will be apparent from the specification.

SUMMARY OF THE INVENTION

The above and other objects and advantages, which will be apparent to one of skill in the art, are achieved in the present invention which is directed to, in a first aspect, a clamping circuit comprising an input terminal for receiving an input voltage; an upper power supply terminal for connection to at least one upper supply voltage; a lower power supply terminal for connection to at least one lower supply voltage, wherein the at least one lower supply voltage is less than the at least one upper supply voltage; a first clamping MOS field effect transistor having a control lead, the first clamping transistor being serially connected between the upper power supply terminal and the input terminal; a second clamping MOS field effect transistor having a control lead, the second clamping MOS field effect transistor being serially connected between the lower power supply terminal and the input terminal; a reference circuit coupled to the control leads of the first and second clamping MOS field effect transistors for maintaining first and second reference voltages at the control leads of the first and second clamping MOS field effect transistors, respectively, the first reference voltage being less than the second reference voltage; and at least one staging circuit coupled to the control lead of at least one of the first and second clamping MOS field effect transistors to determine a selected reference voltage at the control lead to which the at least one staging circuit is coupled.

The first reference voltage is adjusted to switch on the first clamping MOS field effect transistor and connect the input terminal to the at least one upper power supply voltage when the input voltage passes a first clamping and the second reference voltage is adjusted to switch on the second clamping MOS field effect transistor and connect the input terminal to the at least one lower power supply voltage when the input voltage passes a second clamping voltage. The clamping limit voltage is adjusted to the first reference voltage less a threshold voltage of the first clamping MOS field effect transistor. The second clamping voltage is adjusted to the second reference voltage plus a threshold voltage of the second clamping MOS field effect transistor.

The first clamping MOS field effect transistor is an n-type field effect transistor and the second clamping MOS field effect transistor is a p-type field effect transistor. In one embodiment, the first clamping MOS field effect transistor and the second clamping MOS field effect transistor may be constructed as silicon-on-insulator devices.

The reference circuit comprises a third reference transistor coupled to at least one lower power supply terminal and to the control lead of the first clamping MOS field effect transistor and to its own drain, and a fourth reference transistor coupled to at least one upper power supply terminal and to the control lead of the second clamping MOS field effect transistor and to its own drain. The third reference transistor can be coupled to a different lower supply voltage than the second clamping MOS field effect transistor. The fourth reference transistor can be coupled to a different upper supply voltage than the first clamping MOS field effect transistor.

The clamping circuit may comprise more than one staging circuit in parallel and coupled to the control lead of at least one of the first and second clamping MOS field effect transistors to determine a selected reference voltage at the control lead to which the staging circuits are coupled.

In an embodiment of the invention, the at least one staging circuit may comprise a first staging MOS field effect transistor coupled to the control lead of the second clamping MOS field effect transistor and to the control lead of the fourth reference transistor, and a second staging MOS field effect transistor in series with the first staging MOS field effect transistor and at least one supply voltage, the staging circuit to change the second reference voltage.

In another embodiment, the first and second staging MOS field effect transistors are p-type and the second staging MOS field effect transistor is connected in series between the first staging MOS field effect transistor and at least one upper supply voltage. In another embodiment, the first and second staging MOS field effect transistors are n-type and the second staging MOS field effect transistor is connected in series between the first staging MOS field effect transistor and at least one lower supply voltage.

The clamping circuit may further comprise a fifth switching transistor serially connected between the third reference transistor and the fourth reference transistor, the fifth switching transistor having a control lead for switching on and off the clamping circuit. In a different embodiment, the fifth switching transistor is connected to the control lead of the second clamping MOS field effect transistor and further to the drain of the fourth reference transistor and further connected to at least one lower supply voltage; and the clamping circuit has a sixth transistor connected to the control lead of the first clamping MOS field effect transistor, to at least one upper supply voltage, and to the drain of the third reference transistor.

In another embodiment, which is not intended to be exclusive of any other embodiment, the at least one staging circuit may a first staging MOS field effect transistor coupled to the control lead of the first clamping MOS field effect transistor and to the control lead of the third reference transistor, and a second staging MOS field effect transistor in series with the first staging MOS field effect transistor and at least one supply voltage, said staging circuit to change the first reference voltage. The first and second staging MOS field effect transistors may be n-type and the second staging MOS field effect transistor is connected in series between the first staging MOS field effect transistor and at least one lower supply voltage. Alternatively, the first and second staging MOS field effect transistors may be p-type and the second staging MOS field effect transistor is connected in series between the first staging MOS field effect transistor and at least one upper supply voltage.

The clamping circuit may further comprise two turn-off MOS field effect transistors, one each connected between a control lead of a clamping MOS field effect transistor and its respective power supply terminal to turn-off each clamping MOS field effects transistor so it does not have a floating voltage when not in an active clamping state.

In another embodiment, the invention may be considered a clamping circuit comprising an input voltage; a clamping circuit for clamping the input voltage at both a first voltage and at a second voltage wherein the clamping circuit includes a first transistor coupled to a first power supply terminal at the first voltage; and a second transistor coupled to a second power supply terminal at the second voltage; a reference circuit coupled to the first and second transistors for maintaining a preselected gate voltage in the first and second transistors; and a staging circuit coupled to the reference circuit to change the preselected gate voltage of the first and/or second transistors.

The invention may also be considered to be a clamping circuit comprising means to input an input voltage to be clamped; means to clamp the input voltage when it exceeds a first reference voltage minus a threshold voltage of a first clamping transistor; means to clamp the input voltage when it is less than a second reference voltage plus a threshold voltage of a second clamping transistor; and means to change the first reference voltage and/or the second reference voltage. The clamping circuit may further have a means to change the second reference voltage independently of changing the first reference voltage.

And yet, the invention may further be summarized as a clamping circuit comprising an input terminal for receiving an input voltage; an upper power supply terminal for connection to at least one upper supply voltage; a lower power supply terminal for connection to at least one lower supply voltage, the at least one lower supply voltage being less than the at least one upper supply voltage; a first clamping MOS field effect transistor having a control lead and serially connected between the upper power supply terminal and the input terminal; a second clamping MOS field effect transistor having a control lead and serially connected between the lower power supply terminal and the input terminal; a reference circuit comprising a third reference transistor coupled to at least one lower power supply terminal and to the control lead of the first clamping MOS field effect transistor for maintaining a first reference voltage adjusted to switch the first clamping MOS field effect transistor and connect the input terminal to the at least one upper power supply voltage when the input voltage is less than a first reference voltage minus a threshold voltage of the first clamping MOS field effect transistor and a fourth reference transistor coupled to at least one upper supply voltage and to the control lead of the second clamping MOS field effect transistor and having a connected gate and drain for maintaining a second reference voltage adjusted to switch the second clamping MOS field effect transistor and connect the input terminal to the at least one lower power supply voltage when the input voltage is greater than a second reference voltage plus a threshold voltage of the second clamping MOS field effect transistor; the first reference voltage being less than the second reference voltage, and a fifth switching transistor serially connected between the third reference transistor and the fourth reference transistor, the fifth switching transistor having a control lead for switching the clamping circuit on and off. The clamping circuit further comprises a staging circuit to increase the second reference voltage, wherein the staging circuit comprises a staging p-type MOS field effect transistor coupled to the control lead of the second clamping MOS field effect transistor and to the control lead of the fourth reference transistor, and a second staging p-type MOS field effect transistor having a connected gate and drain, the second staging p-type MOS field effect transistor in series with the first staging p-type MOS field effect transistor and at least upper supply voltage. The clamping circuit may further comprises two turn-off MOS field effect transistors, one each connected between a control lead of a respective clamping MOS field effect transistor and its respective power supply terminal to turn off each clamping MOS field effect transistor so it does not have a floating voltage when it is not clamping the input voltage.

BRIEF DESCRIPTION OF THE DRAWINGS

The features of the invention believed to be novel and the elements characteristic of the invention are set forthwith particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1–6 of the drawings in which like numerals refer to like features of the invention.

Figure 1:
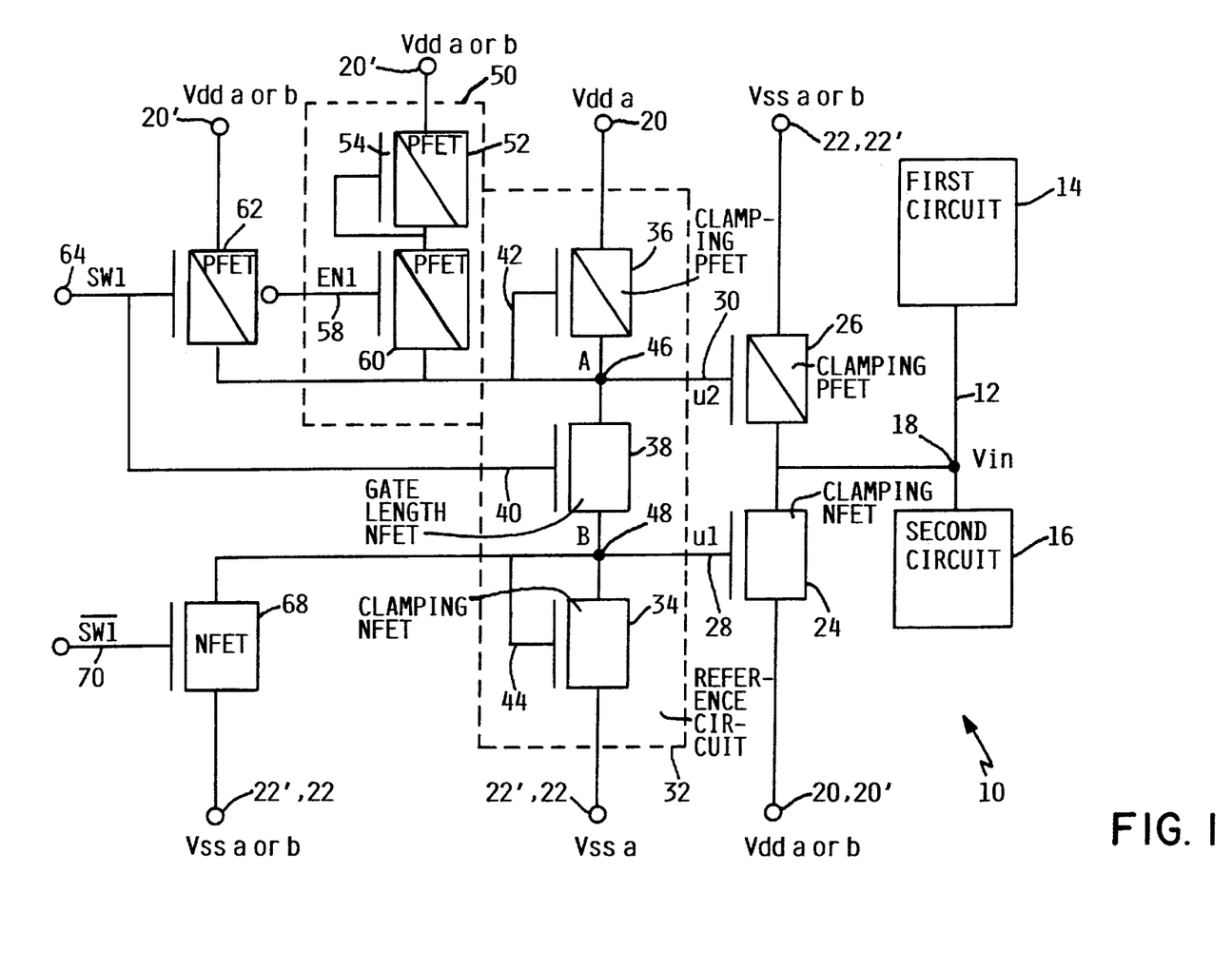
FIG. 1 is a simplified circuit diagram of a clamping circuit for an upper voltage level in accordance with a first embodiment of the present invention.

FIG. 1 shows a first embodiment of a programmable active clamping circuit 10 on a network 12 carrying signals from a first circuit 14 to a second circuit 16. First circuit 14 may be operating at a different voltage than second circuit 16. An input terminal 18 connects the clamping circuit 10 to the input of circuit 16. Generally, the clamping circuit 10 and the second circuit 16 will be constructed simultaneously and the input 18 will be very close to these circuits whereas the first circuit 14 and/or additional circuits communicating over net 12 may be remotely located in the same electronic system or even external to the electronic system in which the clamping circuit 10 and the second circuit are located. It is preferred that the electronic systems in which the circuits 10, 14, and 16 are located are computer systems and the network 12 may be connecting different components such as different memory or processor buses or a memory controller within a single computer system or may be connecting different electronic components between two computer or other electronic systems which need to communicate data.

Figure 3:
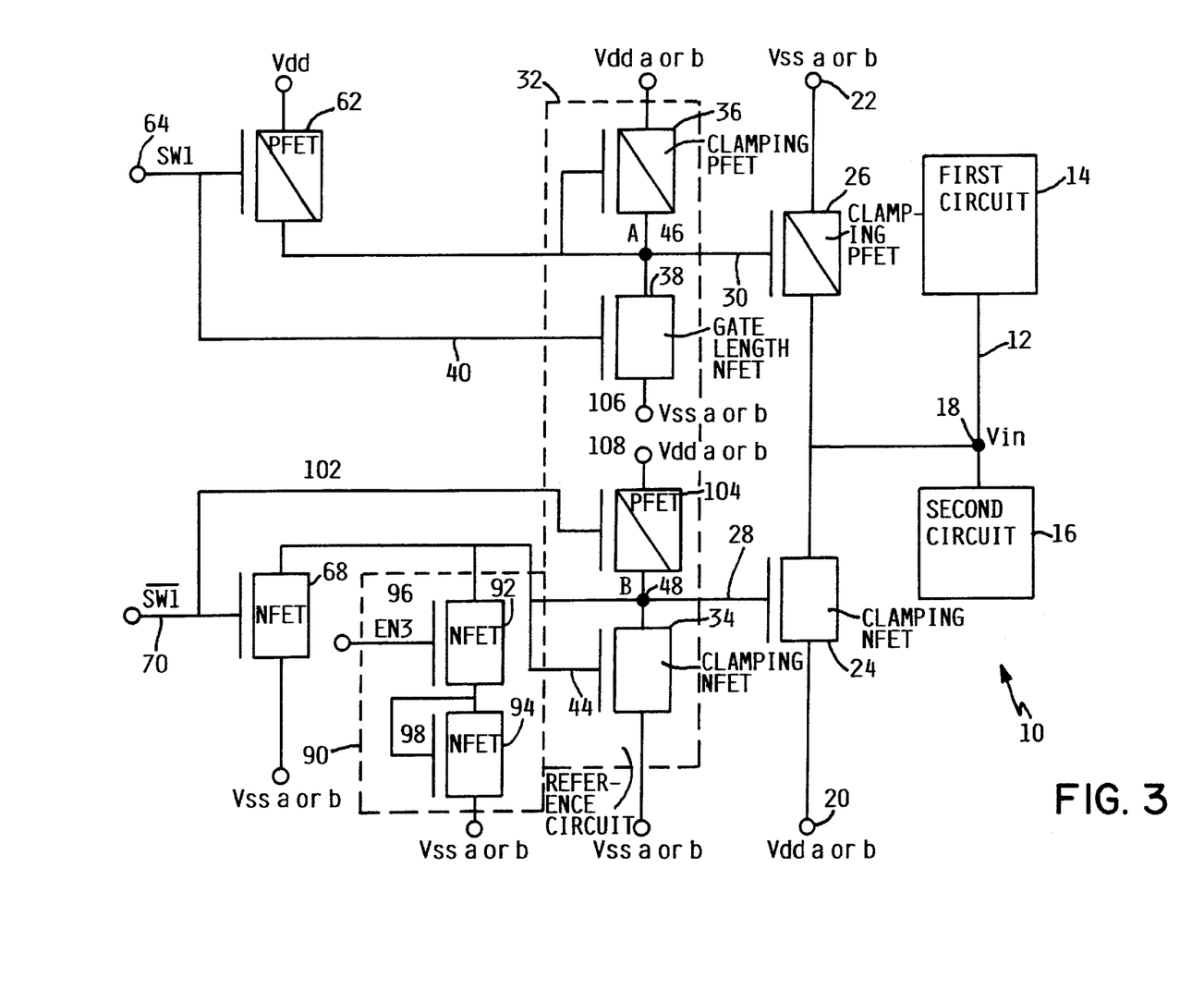
FIG. 3 is a simplified circuit diagram of a clamping circuit having independent biases for the upper voltage and lower voltage supplies in accordance with yet another embodiment and principles of the present invention.
Figure 4:
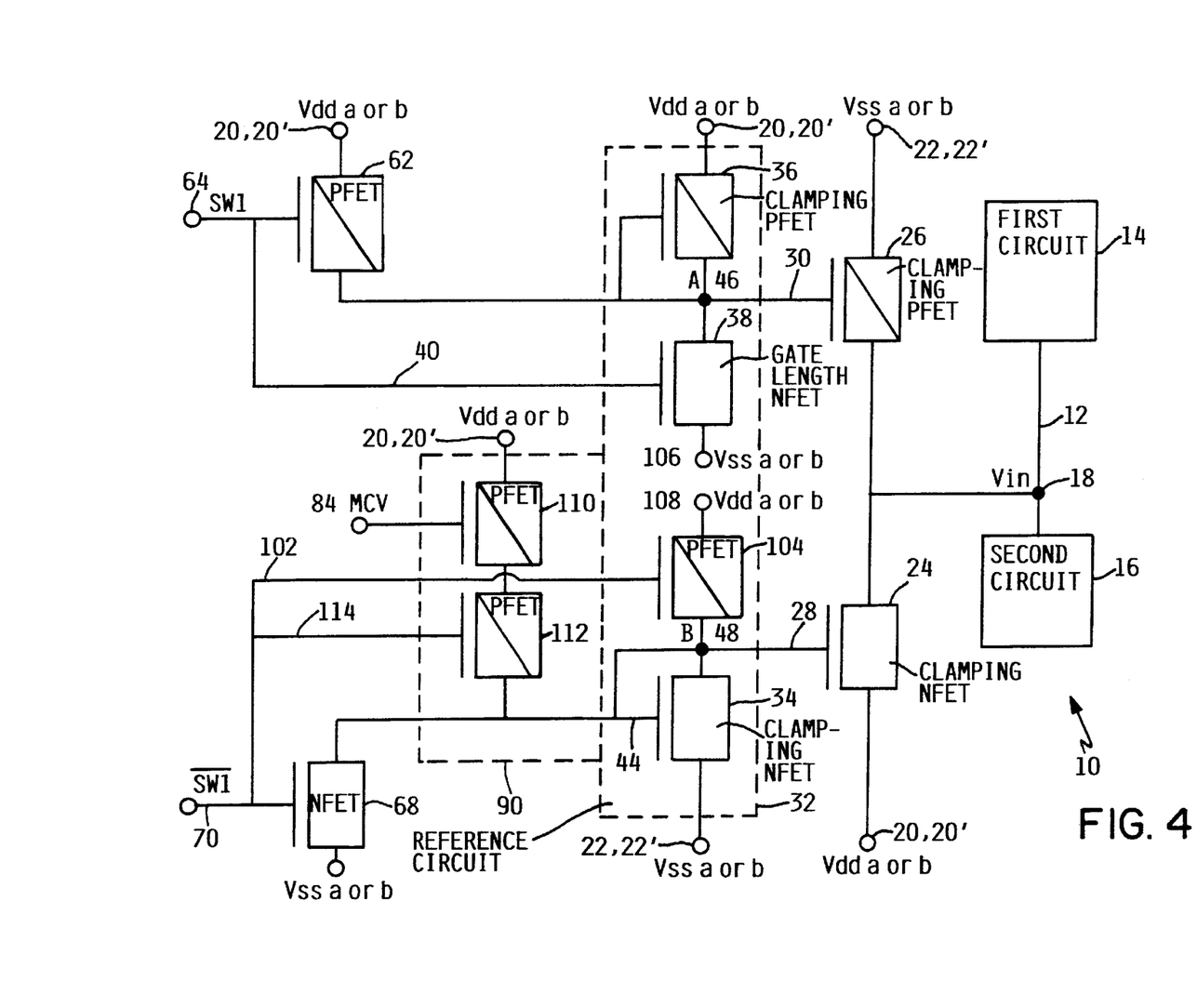
FIG. 4 is yet another simplified circuit diagram of a clamping circuit for a lower voltage level having independent biases for the upper and lower voltage supplies in accordance with an embodiment of the invention.

In the clamping circuit 10 illustrated in the figures, the upper clamping voltage corresponding to a binary one may be set by a reference circuit 32 in conjunction with one or more stages 50 as discussed, and it may be equal to one of the upper power supply voltages $Vdd_{a\ or\ b}$. The lower clamping voltage corresponding to a binary zero may be set by the reference circuit 32 in conjunction with one or more stages 90 as shown in FIGS. 3 and 4 and may be equal to a lower power supply voltage $VSS_{a\ or\ b}$. The lower power supply voltage may be at ground potential or zero volts. It is not always necessary or preferable, however, that the lower power supply voltage to at ground potential. Although clamping circuit 10 shown may be used with standard five volt digital logic designs, it is most valuable when used with circuits in which Vdd is less than 5 volts, such as 3.3 volt, 2.5 volt, 1.8 volt, 1.5 volts, and 1.2 volt or other lower voltage systems.

Figure 2:
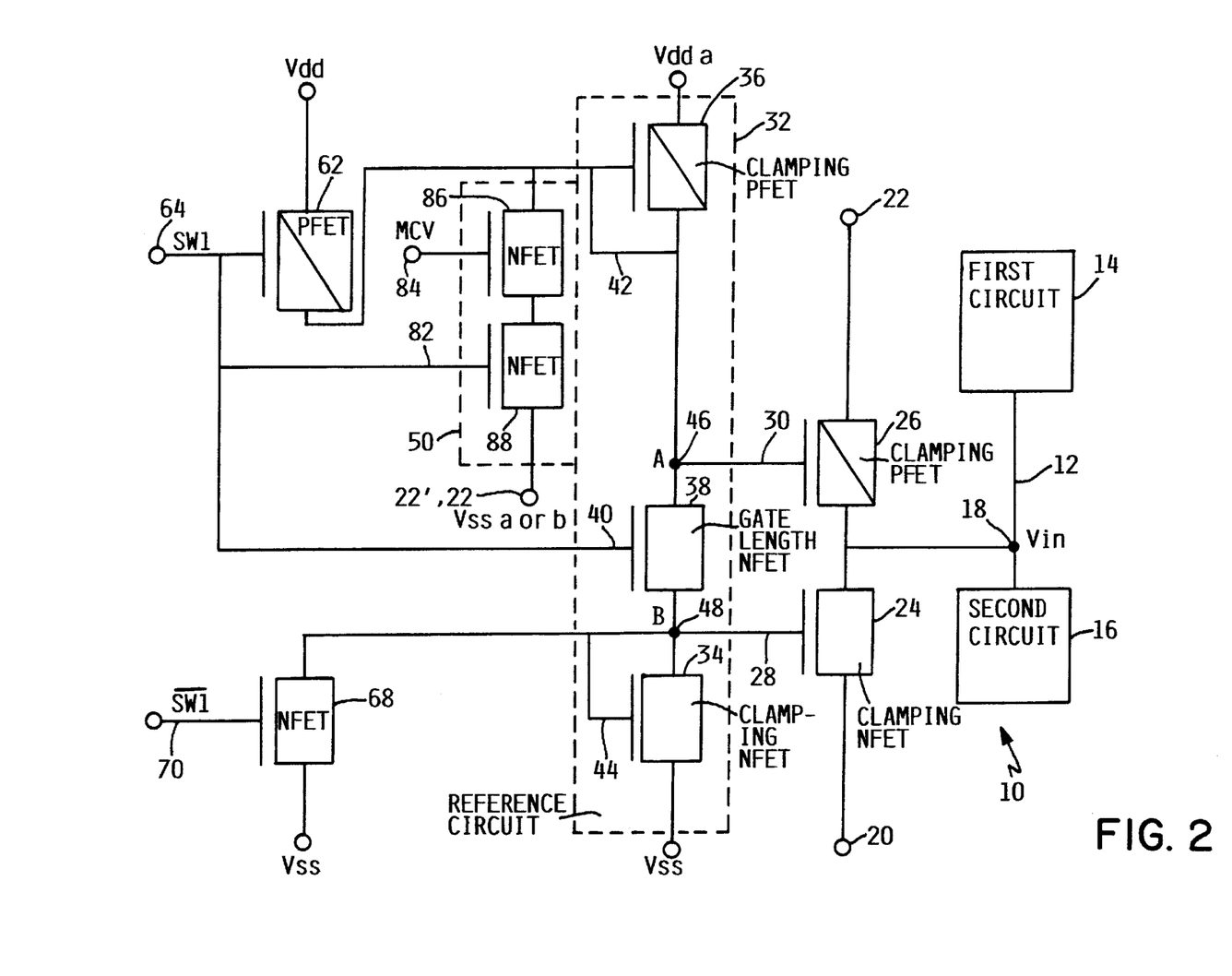
FIG. 2 simplified circuit diagram of a clamping circuit for an upper voltage level in accordance with another embodiment of the present invention.

A key feature of the invention is to be able to control the voltages at node A 46 and node B 48 in the reference circuit 32. A quick overview of the various embodiments is now presented. FIGS. 1 and 2 are simplified circuit schematics of how to adjust the upper clamping voltage by varying the voltage at node A 48. Two embodiments, one in each figure, are shown. The embodiment of FIG. 1 inserts a stage 50 of transistors 52 and 60 connected to an upper voltage power supply 20' in parallel with the upper voltage supply 20 of the reference circuit 32 to raise the clamping voltage. The embodiment of FIG. 2 lowers the clamping voltage at node A 46 by placing a stage 50 of transistors 86 and 88 connected to a lower voltage power supply 22' in parallel with the upper voltage supply 20 of the reference circuit 32. Similarly, complementary transistors can be implemented to change the lower clamping voltage by varying the voltage at node B 48. An example of this is shown in FIG. 3 in which a stage 90 of transistors are placed in parallel with the lower voltage power supply 22 of the reference circuit 32. When the stage 90 comprises other transistors as in FIG. 4, the voltage at node B 48 is increased above $Vss_{a\ or\ b}$. Varying the voltage at node A 46 has little effect on the voltage at node B 48; however, the opposite is not true. Varying the voltage at node B 48 has a substantial effect on the voltage at node A 46. This consequence, of course, can be used to advantage. In the event, however, that it is desirable to vary the voltages at node A 45 independently from node B 48, then the transistors of one dopant type can be biased independently from transistors of the other dopant type. Such an arrangement is also shown in FIGS. 3 and 4.

The circuits and their functions will now be described in more detail. Referring to FIG. 1 again, clamping circuit 10 basically comprises a first clamping transistor 24 and a second clamping transistor 26. It is preferred that the transistors are metal oxide semiconductor field effect transistors (MOSFETs). A MOSFET having a p-type dopant is simply referred to as a pfet; and a MOSFET having a n-type dopant is called a nfet. Others in the art will appreciate that boolean equivalents and/or other transistors of other semiconductor technology can also be used. The gate 28 of clamping nfet 24 is connected to node B 48 in reference circuit 32 and the gate 30 of clamping pfet 26 is connected to node A 46 in reference circuit 32. Clamping circuit 10 is connected to one or more upper power supply voltages $Vdd_{a\ or\ b}$ through upper power supply terminals 20, 20'; and to one or more lower power supply voltages $Vss_{a\ or\ b}$ through lower power supply terminals 22, 22' where $Vdd_a$ is at a different voltage than $Vdd_b$; and $Vss_a$ is at a different voltage than $VSS_b$. The lower power supply voltages $VSS_{a\ or\ b}$ are lower than the upper power supply voltages $Vdd_{a\ or\ b}$. The right half of FIG. 1 is drawn inverted with the upper voltage $Vdd_{a\ or\ b}$ at the bottom and the lower voltage $Vss_{a\ or\ b}$ at the top of the circuit. The upper clamping voltage is selected by enabling the reference circuit 32 to clamp at $Vdd_{a\ or\ b}$ less the threshold voltage of clamping pfet 36 and/or by lowering the voltage at node A 46 by turning on stage 50. The lower clamping voltage is selected by enabling the reference circuit 32 to clamp at $Vss_{a\ or\ b}$ plus the threshold voltage of clamping nfet 34 and/or raising the voltage at node B 48 by turning on stage 90.

Active clamping is accomplished using the clamping nfet 24 and pfet 26. Clamping nfet 24 is serially connected between an upper voltage power supply terminal 20 or 20' and input terminal 18. Clamping nfet 24 is turned on, as described below, to briefly connect input terminal 18 to the upper power supply voltage Vddaorb via terminal 20, 20' whenever the input terminal voltage at 18 is below the clamping lower voltage $Vss_{a\ or\ b}$. Clamping pfet 26 works in a complementary manner to the operation of clamping nfet 24. Clamping pfet 26 is serially connected between the input terminal 18 and a lower voltage power supply terminal 22. Pfet 26 turns on, as described below, to connect input terminal 18 to the lower power supply voltage $Vss_{a\ or\ b}$ whenever the input terminal voltage at 18 is above the upper clamping voltage $Vdd_{a\ or\ b}$. Even though the lower power supply voltage $Vss_{a\ or\ b}$ 22 has been drawn at the top of the circuit on the right half of FIG. 1 and even though the upper clamping pfet 26 is connected to one or more lower power supply voltage $Vss_{a\ or\ b}$, it will be understood from the description above that the clamping pfet 26 controls clamping at the upper clamping voltage and clamping nfet 24 controls clamping about the lower clamping voltage.

Clamping fets 24 and 26 include respective control gates 28 and 30 through which reference circuit 32 controls the switching of the clamping fets 24 and 26 to achieve the desired clamping operation. Reference circuit 32 holds node B 48 at the control gate 28 of clamping nfet 24 at a first constant reference voltage and node A 46 at control gate 30 of clamping pfet 26 at a second constant reference voltage. The first reference voltage is less than the second reference voltage. The lower reference voltage at node B 48 is set by reference circuit 32 to be equal to the threshold voltage of clamping nfet 24 plus $Vss_{a\ or\ b}$. When the voltage at input terminal 18 drops below $Vss_{a\ or\ b}$, the voltage between input terminal 18 and gate 28 of clamping nfet 24 exceeds the threshold voltage for clamping nfet 24. Clamping nfet 24 then turns on, supplying current from a power supply terminals 20, 20' of $Vdd_{a\ or\ b}$ to the input terminal 18 rapidly bringing the input terminal voltage back to $Vss_{a\ or\ b}$. As soon as input terminal 18 has reached $Vss_{a\ or\ b}$, clamping nfet 24 begins to shut off. Similarly, the reference voltage at node A 46 on gate 30 of clamping pfet 26 is set to $Vdd_{a\ or\ b}$ minus the threshold voltage of clamping pfet 26. When the voltage at input terminal 18 exceeds a clamping voltage of the threshold voltage of clamping pfet 26 plus the voltage at node B, it turns on to connect the input terminal 18 to $Vss_{a\ or\ b}$, rapidly reducing the voltage at input terminal 18 to $Vdd_{a\ or\ b}$. In other words, the voltage at node B 48 is set so that clamping nfet 24 turns on whenever noise, ringing or an electrostatic discharge on the circuit causes the input terminal 18 to fall below $Vss_{a\ or\ b}$. Clamping nfet 24 pulls the input voltage at terminal 18 up until it reaches $Vss_{a\ or\ b}$ at which point clamping nfet 24 turns off. Similarly, the reference voltage at node A 46 is set by reference circuit 32 so that clamping pfet 26 turns on whenever the voltage at input terminal 18 rises above the upper clamping voltage and drains the voltage until the upper clamping voltage limit is reached.

In FIG. 1, reference circuit 32 is most easily constructed using a first transistor, preferably a nfet 34, coupled to a lower voltage power supply terminal 22; a second transistor, a pfet 36, coupled to an upper power supply terminal 20; and a third transistor, preferably a large gate length nfet 38, serially connected between the nfet 34 and the pfet 36. A signal SW1 64 controls the gate 40 of nfet 38 which turns it on and off thereby controlling the on/off state of clamping circuit 10. Nfet 38 can turn off the clamping circuit 10 by turning off current flow from the upper power supply $Vdd_{a\ or\ b}$ through pfet 36 and from nfets 38 and 34 to $Vss_{a\ or\ b}$. Although nfet 38 is preferably shown as an n-type MOSFET, if the opposite switching logic is desired, transistor 38 can be a pfet. The gate 42 of pfet 36 is connected between pfet 36 and nfet and to the gate 30 of clamping pfet 26. This automatically sets the reference voltage at node A 46 to $Vdd_{a\ or\ b}$ minus the threshold voltage of pfet 36. Because clamping pfet 26 is the same dopant type as pfet 36, the reference voltage at node A 46 will be correct. The gate 44 of nfet 34 is connected between nfets 34 and 38 and to the gate 28 of clamping nfet 24 to produce the reference voltage at node B 48. This automatically sets the reference voltage at node B 48 at the gate 28 of clamping nfet 24 to $Vss_{a\ or\ b}$ plus the threshold voltage of nfet 34. Likewise, because clamping nfet 24 is also an n-type transistor, the reference voltage at node B 48 is correct.

Nfet 38 acts as a switch which will allows no current to flow when the voltage on gate 40 is low. When no current flows in this path, clamping nfet 24 and clamping pfet 26 are turned off and operate only passively. When the voltage at gate 40 is high, nfet 38 is turned on and current flows from $Vdd_{a\ or\ b}$ through transistors 36, 38 and 34 to the lower power supply voltage $Vss_{a\ or\ b}$, setting the reference voltages at node A 46 and node B 48 as described above. It is noted that clamping nfet 24 is on all the time so that when signal SW1 64 is off, the voltage at gate 40 of switching nfet 38 is low and the clamping nfet 24 and clamping pfet 26 can float. To ensure that these clamping transistors do not float and are truly off, a pfet 62 terminates the upper voltage power supply and a nfet 68 terminates the lower voltage power supply.

Although the reference circuit 32 of the U.S. patent application Ser. No. 09/065,800 entitled, "Switchable Active Clamp Network" is simple and highly effective, the basic reference circuit 32 can be expanded to provide the desired reference voltages at node A 46 and node B 48. These other reference voltages set the clamping voltages at which the clamping circuit begins to operate. Whenever the range between the two clamping voltages is exceeded, the clamping action begins. Most often, the lower clamping voltage will be set to the lower digital voltage at ground potential and the upper clamping voltage will be set to the upper digital voltage. As mentioned, one can connect pfet 36 to a different voltage supply than clamping pfet 26 and/or connect nfet 34 to a different voltage supply than clamping nfet 24. If higher performance circuit operation is desired, however, the reference voltage at node A 46 can be raised with stages of pfets or lowered with stages of nfets. The reference voltage at node B can be lowered with stages of nfets or raised with stages of pfets. These aspects of the Invention will be further disclosed herein. Another technique to vary the clamping voltages is to lower the resistance of nfet 38 or change the characteristics of nfet 34 or pfet 36 to increase the steady state current at the upper and lower digital voltage levels and reduce the overshoot and voltage swing of the clamping circuit 10 and the net 12. Typically the circuit of this invention will be implemented on a single chip with circuit 16 and the characteristics of all the transistors may be adjusted during construction.

In the embodiment of FIG. 1, there is a stage 50 which when connected in parallel to the reference circuit 32 behaves as a resistor to raise the voltage at node A 46. Stage 50, in this embodiment, comprises two connected pfets 52 and 60. Pfets 52 and 60 are interconnected with each other in that the source of pfet 60 is connected to both the gate and the drain of the second pfet 52. The source of the second pfet 52 is connected to an upper voltage power supply 20', which may be at the same or at a different voltage than the upper voltage power supply 20. The drain of a pfet 60 is connected to the gate 30 of the corresponding clamping pfet 26. When the EN1 signal 58 goes low, pfet 60 turns on and provides current through pfet 52. When the SW1 signal 64 turns on the gate of pfet 38, current is conducted through the parallel combination of pfet 36 and staging circuit 50. There can be more than one stage 50 connected to different voltage power supplies and with different width of pfets to vary the voltage at node A 46 which in turn customizes the voltage level at which clamping occurs.

FIG. 2 is a simplified schematic of another embodiment of the clamping circuit 10 capable of lowering the voltage at node A 46 while maintaining the voltage at node B 48. In this embodiment, stage 50 comprises two nfets 86 and 88 in series. The source of nfet 88 is connected to a lower voltage terminal $Vss_{a\ or\ b}$ 22, 22' and its drain is connected to another nfet 86. The drain of nfet 86 is connected to both the gate and drain of pfet 36 in the reference circuit 32. The gate of nfet 86 is controlled by an input signal MCV 84 and the gate of nfet 88 is controlled by a signal SW1 64 which also turns on the reference circuit 32. Using a stage of nfets connected to the lower voltage power supplies and to pfet 36, the voltage at node A 46 can be decreased. Thus, the input voltage at which clamping occurs can be decreased according to the dimensions of the nfets in stage 50 and the lower voltage power supplies to which they are connected.

FIGS. 3 and 4 provide simplified schematics of a clamping circuit 10 which combines two additional aspects of the invention. Not only can the lower clamping voltage be controlled in a similar but complementary manner to that described in FIGS. 1 and 2, but the voltages at node A 46 and node B 48 can be independently controlled when the pfets of the reference circuit and the stages are biased independently from the nfets. With independent biasing, it is possible to vary both the upper and lower clamping voltages as described herein. While FIGS. 3 and 4 do not illustrate stage 50 to adjust the upper clamping voltage at node A 46 as illustrated in FIGS. 1 and 2 and the corresponding discussion, one can appreciate that the features of FIGS. 1 and 2 can be combined with the features of FIGS. 3 and 4 to independently adjust the voltages at node A 46 and at node B 48.

In FIG. 3, a first circuit 14 is connected over a net 12 to a second circuit 16 as before. Also, as before, the input terminal 18 between the first and second circuits 14 and 16 is also between the clamping pfet 26 connected to a lower power supply terminal and the clamping nfet 24 connected to a higher power supply terminal. The gates of each clamping transistor is connected to a reference circuit 32. The gate of the clamping pfet 26 is connected to reference circuit 32 at node A 46 between pfet 36 and the switching nfet 38. But, rather than the switching nfet 38 being connected through pfet 34 to a lower power supply it is connected to a separate power supply voltage 106. Pfet 62 properly terminates the clamping pfet 26 so that it does not retain a floating voltage when turned off. Rather than being connected to an upper power supply through switching nfet 38 and pfet 36, nfet 34 of the reference circuit 32 is connected at node B 48 to a pfet 104 connected to an upper power supply terminal 108. The gate 102 of the pfet 104 is connected to a signal $\overline{SW1}$ 70 which, when low, turns on pfet 104 and drains current into nfet 34. The gate 44 of nfet 34 of the reference circuit 32 is connected in parallel to a stage 90 of nfets 92 and 94. Stage 90 in FIG. 3 is analogous to stage 50 in FIG. 1. Stage 90 comprises two nfets in series with each other in which the drain of nfet 92 is connected to the gate 98 and the source of nfets 94. The drain of nfet 94 is connected to a lower power supply 22, 22'. Nfet 68 is connected to signal $\overline{SW1}$ 70 and drains any excess floating voltage off of clamping nfet 24. When enabled by EN3 signal 96 the stage 90 of nfets 92 and 94 act as a resistor in parallel with nfet 34 to adjust the voltage at node B downward slightly.

In FIG. 4, stage 90 comprises two pfets in series in which the source of one pfet 110 is connected to the upper voltage power supply and the drain of the other pfet 112 is connected to node B 48 and the gate 44 of nfet 34 of the reference circuit. When enabled with the MCV signal 84 at the gate of pfet 110 and when enabled with signal $\overline{SW1}$ 70, stage 90 of pfets 110 and 112 act to increase the voltage at node B 48. Using these techniques, the lower clamping voltage can be adjusted.

The circuits of FIGS. 1–4 have been described using conventional MOS technology in which the MOS transistors are constructed on a common semiconductor substrate. Discrete components might also be used or the clamping circuit 10 might be constructed with silicon-on-insulator or silicon-on-sapphire or other technologies. In a conventional MOS technology implementation, the nfets would be constructed on the p-type substrate. The potential of the p-type substrate is not usually shown in circuit diagrams, but most often it is connected to Vss or ground potential. The pfets, such as clamping pfet 26, would be constructed within wells of n-type material and these wells would most commonly be connected to Vdd but the connection of the substrate and n-type wells to the Vss and Vdd rails is not required, and in some implementations it may be desirable to adjust or modulate the potential of the n-wells or the substrate to modify the operation of the transistors and achieve particular performance objectives. In conventional MOS technology the extent to which the potential of the surrounding semiconductor material can be adjusted is limited because multiple transistors may be constructed within the same n-well or on the same p-type substrate. However, in SOI and bulk triple well implementations, the electrical isolation provided by the technology allows the potential of the surrounding semiconductor material to be adjusted relatively easily. Accordingly, the circuit of any of the preceding figures may be implemented in an SOI or bulk triple well implementation with the potential of the surrounding semiconductor material of each transistor adjusted to a desired level which may be $Vss_{a\ or\ b}$, $Vdd_{a\ or\ b}$, some other fixed reference voltage, a modulated voltage, or the potentials may be allowed to float in a floating body SOI implementation.

In SOI and bulk triple well processes the body of each transistor, or of desired groups of transistors, may be electrically isolated from the body of other transistors on the substrate. This allows the potential of the isolated semiconductor material to be adjusted without affecting the performance of other transistors. In SOI designs, the transistors are isolated by an insulating oxide layer. In bulk triple well designs, the transistors are isolated by wells which are multiple concentric doped regions of decreasing size. The wells isolate the diode junction islands within which the transistors are formed.

Figure 5:
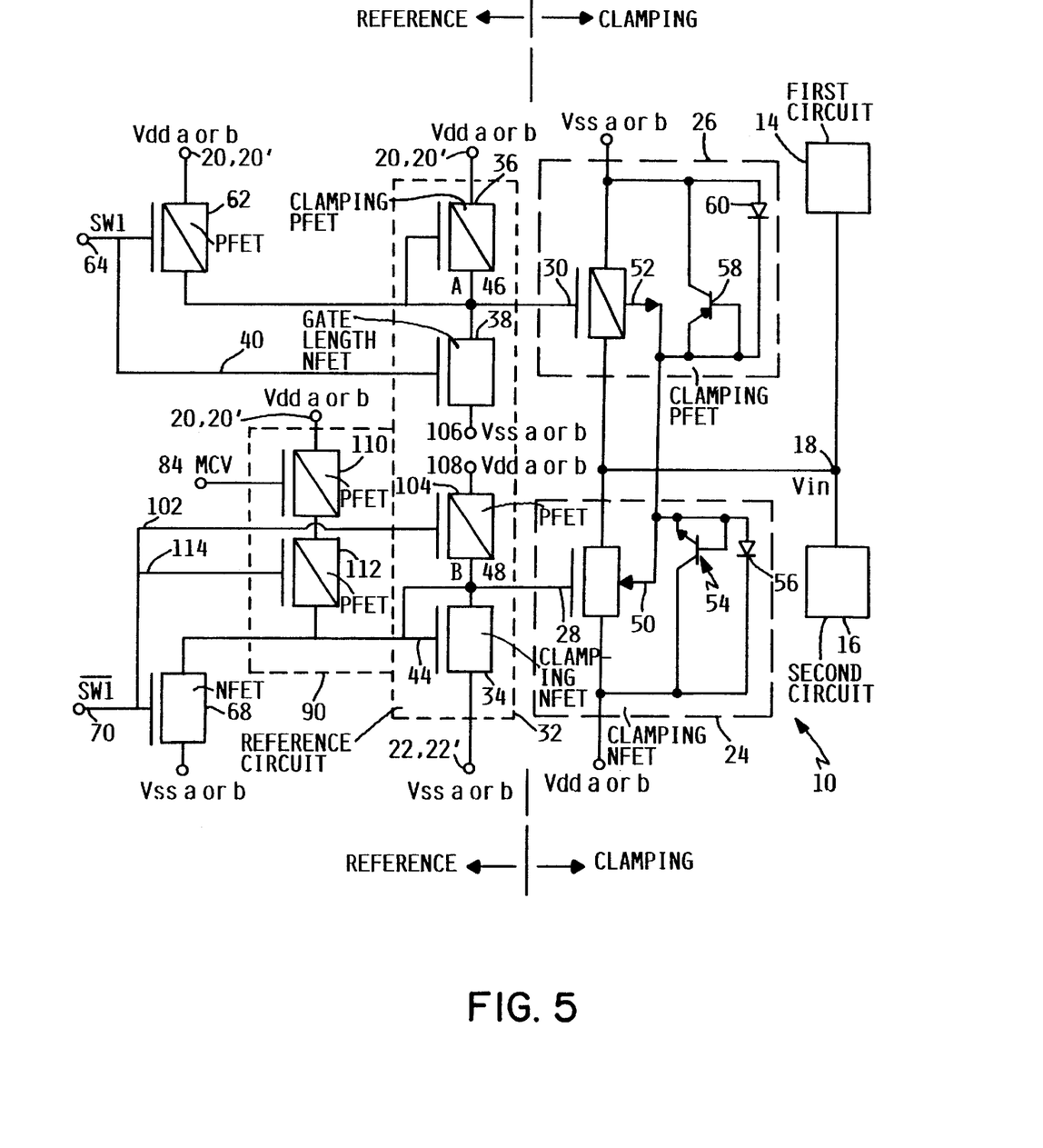
FIG. 5 is a simplified circuit diagram of a clamping circuit in which DTMOS field effect transistors are used and parasitic bipolar transistors and diode junctions are shown suitable for SOI and triple well applications in accordance with principles of the invention.

FIG. 5 is provided to show one particular SOI or bulk triple well design with specific advantages for the present invention. The right side of FIG. 5 labeled CLAMPING embodies the clamping MOSFETs 24 and 26 of FIGS. 1–4 in SOI and built triple well technology. The left half of the figure labeled REFERENCE shows the reference circuit of FIG. 4 but one can easily realize than any of the reference circuits and/or stages with or without independent biasing may be implemented into the clamping circuit 10 of FIG. 5. Clamping nfet 24 comprises with a parasitic npn transistor 120 and a parasitic diode 122; Clamping pfet 26 comprises a parasitic pnp transistor 130 and parasitic diode 132. While these parasitic elements are also found in conventional MOS technologies, they play a different and important role in the SOI/triple well design resulting from the modulated potential of the bodies of clamping MOSFETs 24 and 26. Body leads 124 and 134 connect the surrounding semiconductor material, i.e., the bodies, of these two transistors 24 and 26. FIG. 5 also shows other parasitic diode and bipolar semiconductor elements. During construction of a MOSFET with SOI/triple well or similar technology, it is possible to connect the body of the transistor to the gate structure on the device. When the body is tied to the gate in this way, the threshold voltage, i.e., the voltage needed to turn on the transistor, decreases with increasing body voltage thereby resulting in a MOSFET with a dynamic threshold, generally referred to in the art as a dynamic threshold MOS (DTMOS) transistor.

Transistors 24 and 26, when bodies 124 and 134 are connected as shown in FIG. 5 also provide dynamic threshold operation, and for the purpose of this invention are also considered DTMOS transistors. However, in the embodiments shown in FIGS. 1–4, the bodies are not connected to the gates, but instead, are connected to the input 18. A first benefit from the use of DTMOS devices in this invention is directly resulting from the dynamic threshold voltage operation described above. In the other implementations of FIGS. 1–4, the clamping MOSFETs 24 and 26 begin to turn on as soon as the input terminal voltage at 18 begins to exceed the normal digital voltage range of $Vss_{a\ or\ b}$ to $Vdd_{a\ or\ b}$. The extent to which the MOSFETs 24 and 26 are turned on is related to the amount by which the voltage between the gate of the MOSFET and the input terminal 18 differs from the MOSFET's threshold voltage. The greater this difference, the larger the current flow through the MOSFET and the faster that the input terminal voltage is clamped. In the DTMOS design shown in FIG. 5, the same action occurs, but the rate at which the transistors turn on and the extent to which they are turned on is greatly increased because the threshold voltage dynamically falls as the MOSFET turns on, instead of remaining constant. As the input voltage rises at 18, in the vicinity of $Vdd_{a\ or\ b}$, e.g. 1.5 volts, the threshold voltage of clamping pfet 26 dynamically decreases turning on clamping pfet 26 in the dynamic threshold mode more quickly and more completely than in a non-DTMOS design of the type shown in FIGS. 1–4. Clamping nfet 24 operates in a similar manner in the vicinity of 0.0 volts or other $Vss_{a\ or\ b}$. This operation significantly increases the performance of clamping circuit 10 over a MOSFET operated without the dynamic threshold feature.

A second advantage relates to the parasitic diodes 122 and 132. In the design shown in FIG. 5, the bodies of the transistors 24, 26 are connected to the input terminal 18 via body connection leads 124 and 134. This allows parasitic diodes 122 and 132 to act between the power supply voltages and the input terminal in the same way as a prior art passive diode clamp acts. Parasitic diode 122 turns on whenever the voltage at input terminal 18 exceeds $Vdd_{a\ or\ b}$ plus the turn on voltage of diode 122. Parasitic diode 132 turns on whenever the input voltage 18 falls below a diode drop beneath $Vss_{a\ or\ b}$. When these diodes turn on, they provide additional clamping and protection beyond that provided by the performance of the transistors themselves. While this first type of improved performance is valuable, it can be seen that it only begins to operate when the noise exceeds a diode drop above or below the normal digital voltage range of $Vss_{a\ or\ b}$ to $Vdd_{a\ or\ b}$.

Another performance improvement results from the action of the parasitic bipolar transistors 120 and 130 which automatically provide additional bypass protection for both clamping and ESD protection of the circuit. From the description above, it will be seen that the dynamic threshold active clamp network of FIG. 5 turns on very strongly as soon as noise at the input terminal 18 begins to exceed the normal range of $Vss_{a\ or\ b}$ to $Vdd_{a\ or\ b}$. If the input terminal voltage moves more than about 0.7 volts outside the normal digital voltage range, the diode parasitic diodes 122 and 132 also turn on thus improving performance even more. This performance is so effective that an additional ESD protection device may not be necessary to protect this circuit or the input/output networks attached thereto. The parasitic elements in FIG. 5 are active even when the device is not powered which provides significant ESD protection during handling of the device. It has been demonstrated that even the non-body coupled active clamp circuit of FIGS. 14 are as good as or superior to the standard diode networks in conventional MOS designs. Finally, it has been shown that body-coupled transistors in SOI designs are significantly superior to standard MOSFETs for ESD robustness. It has been experimentally shown that body-coupled transistors in a configuration such as is shown in FIG. 5 can achieve 3.8 to 4.8 kilovolt protection levels in SOI implementations. The implementations shown result in a clean signal on net 12 with decreased noise and high reflection coefficient within the voltage swing. This permits multiple drop point nets instead of point-to-point configurations and provide slower power consumption as compared to split resistive termination networks. This also permits long networks with relatively high line resistance. It also permits lower voltage swing MOS designs using lower voltage power supplies.

Figure 6:
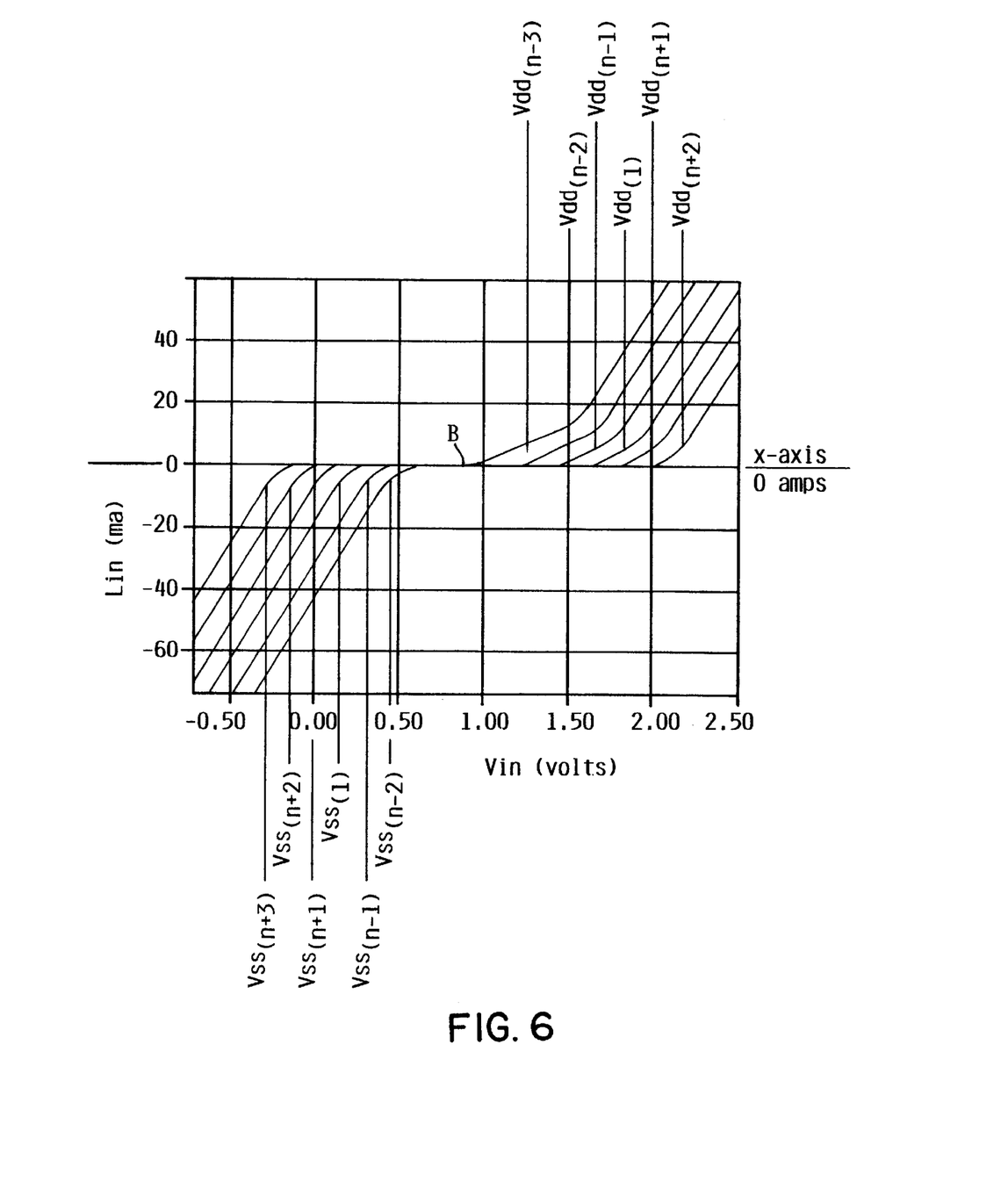
FIG. 6 is a graph having several curves depicting input current as a function of various voltages for various embodiments of an active clamping circuit constructed according to the present invention.

FIG. 6 illustrates a family of graphs showing current into clamping circuit 10 through input terminal 18 as a function of the input voltage $V_{in}$ where $Vss_n$ represents the curves below the x-axis or 0 volts and $Vdd_n$ represents the voltages above the x-axis. The point at which each curve above the labeled x-axis has a positive slope and takes off from the x-axis is the upper clamping voltage set by enabling one or more stages 50 in the clamping circuit 10 of FIGS. 1–5. Similarly, each curve below the labeled x-axis represents a different lower clamping voltage set by enabling one or more different stages 90 of the clamping circuit in FIGS. 1–5. Thus, the operating range of the clamping circuit can be customized by enabling different stages of the clamping circuit 10. In the region marked A where Vin is less than $Vss_n$, clamping nfet 24 is on and current is flowing out of the clamping circuit 10 and into the network 12 at the input to circuit 16. In the region marked B, there is no current flow through the input terminal 18 and both clamping transistors 24 and 26 are off. In the region marked C, above $Vdd_n$, clamping pfet 26 is turned on and current is flowing in the opposite direction from the input terminal 18 through clamping pfet 26 to the lower power supply to which clamping nfet is connects. The slope of each curve is constant and represents the impedance of the clamp.

The invention has been described mostly in terms of adjusting the voltage at which the clamp becomes active. For example, clamping circuit 10 should be fairly aggressive in clamping the voltage input from circuit 14 at 0 volts and at 1.5 volts if that is the voltage driven by the circuit 14. By adjusting the voltages at node A 46 and node B 48, the clamping circuit 10 is made to be aggressive at other voltage levels. To clamp "aggressively" the clamping fets, nfet 24 and pfet 26, must have an impedance close to the transmission line, e.g., net 12 at fifty ohms within one hundred millivolts or so beyond the start of the clamping action. For example, in the case of clamping at 0 volts and at 1.5 volts, the clamping nfet 24 and clamping pfet 26 may have fifty ohms impedance and start conducting at –100 millivolts and at 1.6 volts, respectively, so that at the clamping voltages levels of 0 and 1.5 volts, the clamping nfet 24 and clamping pfet 26 are already conducting 0.5 milliamps.

A further advantage of the invention as described herein is that the clamping circuit 10 can be made to be less aggressive in a system where power dissipation is more critical than the highest possible performance. Thus, clamping circuit 10 can be used in both a high end server as well as, e.g., a battery powered laptop computer. When operating in a laptop environment or any other environment in which it is desirable to conserve power, the clamping circuit 10 can adjust the onset of clamping action to greatly reduce clamping currents at, for example, 0 volts or 1.5 volts. The gate of the clamping nfet 24 can be adjusted downward by, e.g., 200 millivolts so that virtually no current flows through the device when the output is at 0 volts. At –200 millivolts the clamping nfet 24 will be conducting a slight current, e.g., on the order of 0.500 milliamps. Similarly the gate of clamping pfet 26 can be biased more positively so that clamping is moved upward to reduce or eliminate current when the output is at the clamping voltage, e.g., 1.5 volts while still providing termination for overshoots.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A clamping circuit comprising:
   (a) an input terminal for receiving an input voltage;
   (b) an upper power supply terminal for connection to at least one upper supply voltage;
   (c) a lower power supply terminal for connection to at least one lower supply voltage, the at least one lower supply voltage being less than the at least one upper supply voltage;
   (d) a first clamping MOS field effect transistor having a control lead, the first clamping transistor being serially connected between the upper power supply terminal and the input terminal;
   (e) a second clamping MOS field effect transistor having a control lead, the second clamping MOS field effect transistor being serially connected between the lower power supply terminal and the input terminal;
   (f) a reference circuit coupled to the control leads of the first and second clamping MOS field effect transistors for maintaining first and second reference voltages at the control leads of the first and second clamping MOS field effect transistors, respectively, the first reference voltage being less than the second reference voltage; and
   (g) at least one staging circuit coupled to the control lead of at least one of the first and second clamping MOS field effect transistors to determine a selected reference voltage at the control lead to which the at least one staging circuit is coupled.

2. The clamping circuit of claim 1, wherein the first reference voltage is adjusted to switch on the first clamping MOS field effect transistor and connect the input terminal to the at least one upper power supply voltage when the input voltage passes a first clamping voltage and the second reference voltage is adjusted to switch on the second clamping MOS field effect transistor and connect the input terminal to the at least one lower power supply voltage when the input voltage passes a second clamping voltage.

3. The clamping circuit of claim 2, wherein the first clamping voltage is adjusted to the first reference voltage less a threshold voltage of the first clamping MOS field effect transistor.

4. The clamping circuit of claim 2, wherein the second clamping voltage is adjusted to the second reference voltage plus a threshold voltage of the second clamping MOS field effect transistor.

5. The clamping circuit of claim 1, wherein the first clamping MOS field effect transistor is an n-type field effect transistor and the second clamping MOS field effect transistor is a p-type field effect transistor.

6. The clamping circuit of claim 5, wherein the first clamping MOS field effect transistor and the second clamping MOS field effect transistor are constructed as silicon-on-insulator devices.

7. The clamping circuit of claim 1, wherein the reference circuit comprises a third reference transistor coupled to at least one lower power supply terminal and to the control lead of the first clamping MOS field effect transistor and to its own drain, and a fourth reference transistor coupled to at least one upper power supply terminal and to the control lead of the second clamping MOS field effect transistor and to its own drain.

8. The clamping circuit of claim 7, wherein the third reference transistor can be coupled to a different lower supply voltage than the second clamping MOS field effect transistor.

9. The clamping circuit of claim 7, wherein the fourth reference transistor can be coupled to a different upper supply voltage than the first clamping MOS field effect transistor.

10. The clamping circuit of claim 1, further comprising more than one staging circuit in parallel and coupled to the control lead of at least one of the first and second clamping MOS field effect transistors to determine a selected reference voltage at the control lead to which the staging circuits are coupled.

11. The clamping circuit of claim 7, wherein the at least one staging circuit comprises a first staging MOS field effect transistor coupled to the control lead of the second clamping MOS field effect transistor and to the control lead of the fourth reference transistor, and a second staging MOS field effect transistor in series with the first staging MOS field effect transistor and at least one supply voltage, said staging circuit to change the second reference voltage.

12. The clamping circuit of claim 11, wherein the first and second staging MOS field effect transistors are p-type and the second staging MOS field effect transistor is connected in series between the first staging MOS field effect transistor and at least one upper supply voltage.

13. The clamping circuit of claim 11, wherein the first and second staging MOS field effect transistors are n-type and the second staging MOS field effect transistor is connected in series between the first staging MOS field effect transistor and at least one lower supply voltage.

14. The clamping circuit of claim 7, further including a fifth switching transistor serially connected between the third reference transistor and the fourth reference transistor, the fifth switching transistor having a control lead for switching on and off the clamping circuit.

15. The clamping circuit of claim 7, further comprising a fifth switching transistor connected to the control lead of the second clamping MOS field effect transistor and further to the drain of the fourth reference transistor and further connected to at least one lower supply voltage; and a sixth transistor connected to the control lead of the first clamping MOS field effect transistor, to at least one upper supply voltage, and to the drain of the third reference transistor.

16. The clamping circuit of claim 15, wherein the at least one staging circuit comprises a first staging MOS field effect transistor coupled to the control lead of the first clamping MOS field effect transistor and to the control lead of the third reference transistor, and a second staging MOS field effect transistor in series with the first staging MOS field effect transistor and at least one supply voltage, said staging circuit to change the first reference voltage.

17. The clamping circuit of claim 16, wherein the first and second staging MOS field effect transistors are n-type and the second staging MOS field effect transistor is connected in series between the first staging MOS field effect transistor and at least one lower supply voltage.

18. The clamping circuit of claim 16, wherein the first and second staging MOS field effect transistors are p-type and the second staging MOS field effect transistor is connected in series between the first staging MOS field effect transistor and at least one upper supply voltage.

19. The clamping circuit of claim 1, further comprising two turn-off MOS field effect transistors, one each connected between a control lead of a clamping MOS field effect transistor and its respective power supply terminal to turn off each clamping MOS field effects transistor so it does not have a floating voltage when not in an active clamping state.

20. A clamping circuit,
(a) an input terminal for receiving an input voltage;
(b) an upper power supply terminal for connection to at least one upper supply voltage;
(c) a lower power supply terminal for connection to at least one lower supply voltage, the at least one lower supply voltage being less than the at least one upper supply voltage;
(d) a first clamping MOS field effect transistor having a control lead and serially connected between the upper power supply terminal and the input terminal;
(e) a second clamping MOS field effect transistor having a control lead and serially connected between the lower power supply terminal and the input terminal;
(f) a reference circuit comprising:
(i) a third reference transistor coupled to at least one lower power supply terminal and to the control lead of the first clamping MOS field effect transistor for maintaining a first reference voltage adjusted to switch the first clamping MOS field effect transistor and connect the input terminal to the at least one upper power supply voltage when the input voltage is less than a first reference voltage minus a threshold voltage of the first clamping MOS field effect transistor;
(ii) a fourth reference transistor coupled to at least one upper supply voltage and to the control lead of the second clamping MOS field effect transistor and having a connected gate and drain for maintaining a second reference voltage adjusted to switch the second clamping MOS field effect transistor and connect the input terminal to the at least one lower power supply voltage when the input voltage is greater than a second reference voltage plus a threshold voltage of the second clamping MOS field effect transistor; the first reference voltage being less than the second reference voltage;
(iii) a fifth switching transistor serially connected between the third reference transistor and the fourth reference transistor, the fifth switching transistor having a control lead for switching the clamping circuit on and off;
(g) a staging circuit to increase the second reference voltage, said staging circuit comprising:
(i) a staging p-type MOS field effect transistor coupled to the control lead of the second clamping MOS field effect transistor and to the control lead of the fourth reference transistor, and
(ii) a second staging p-type MOS field effect transistor having a connected gate and drain, the second staging p-type MOS field effect transistor in series with the first staging p-type MOS field effect transistor and at least upper supply voltage; and
(h) two turnoff MOS field effect transistors, one each connected between a control lead of a respective clamping MOS field effect transistor and its respective power supply terminal to turn off each clamping MOS field effect transistor so it does not have a floating voltage when it is not clamping the input voltage.

* * * * *